(12) United States Patent
Lee et al.

(10) Patent No.: US 12,451,437 B2
(45) Date of Patent: Oct. 21, 2025

(54) SEMICONDUCTOR PACKAGES HAVING FIXING MEMBERS

(71) Applicant: Samsung Electronics Co., Ltd., Suwon-si (KR)

(72) Inventors: Yongkwan Lee, Hwaseong-si (KR); Seunghwan Kim, Asan-si (KR); Jungjoo Kim, Suwon-si (KR); Jongwan Kim, Cheonan-si (KR); Junwoo Park, Asan-si (KR); Hyunggil Baek, Suwon-si (KR); Junga Lee, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 442 days.

(21) Appl. No.: 18/107,143

(22) Filed: Feb. 8, 2023

(65) Prior Publication Data

US 2023/0260926 A1 Aug. 17, 2023

(30) Foreign Application Priority Data

Feb. 16, 2022 (KR) .......................... 10-2022-0019905

(51) Int. Cl.
*H01L 23/544* (2006.01)
*H01L 21/48* (2006.01)
(Continued)

(52) U.S. Cl.
CPC ........ *H01L 23/544* (2013.01); *H01L 21/4846* (2013.01); *H01L 21/563* (2013.01);
(Continued)

(58) Field of Classification Search
CPC ............. H01L 23/13–20; H01L 23/544; H01L 23/3128; H01L 23/5383; H01L 23/562;
(Continued)

(56) References Cited

U.S. PATENT DOCUMENTS 6,201,305 B1 * 3/2001 Darveaux .............. H05K 1/111
257/781
6,472,608 B2 10/2002 Nakayama
(Continued)

FOREIGN PATENT DOCUMENTS

JP 2015226050 A 12/2015
KR 1019980068017 A 10/1998
(Continued)

*Primary Examiner* — Alonzo Chambliss
(74) *Attorney, Agent, or Firm* — Muir Patent Law, PLLC

(57) ABSTRACT

A semiconductor package includes an interposer including an upper pad and an upper passivation layer partially covering the upper pad, a semiconductor chip disposed on the interposer, a conductor pattern disposed on the interposer, a guide pattern disposed on the interposer while including a main opening and at least one sub-opening connected to the main opening, a support disposed on the interposer while including a core portion and a peripheral portion surrounding the core portion, a lower surface of the support being disposed in the main opening of the guide pattern, an upper redistribution structure disposed on the semiconductor chip and connected to the conductor pattern and the guide pattern, and an encapsulant between the interposer and the upper redistribution structure. The encapsulant contacts an inner wall of the main opening, an inner wall of the at least one sub-opening and a side surface of the support.

20 Claims, 16 Drawing Sheets

(51) Int. Cl.
*H01L 21/56* (2006.01)
*H01L 23/00* (2006.01)
*H01L 23/31* (2006.01)
*H01L 23/498* (2006.01)
*H01L 23/538* (2006.01)
*H01L 25/10* (2006.01)

(52) U.S. Cl.
CPC .... *H01L 23/3128* (2013.01); *H01L 23/49811* (2013.01); *H01L 23/5383* (2013.01); *H01L 23/5385* (2013.01); *H01L 23/562* (2013.01); *H01L 25/105* (2013.01); *H01L 24/16* (2013.01); *H01L 24/32* (2013.01); *H01L 24/73* (2013.01); *H01L 24/92* (2013.01); *H01L 2223/54426* (2013.01); *H01L 2224/16227* (2013.01); *H01L 2224/32225* (2013.01); *H01L 2224/73204* (2013.01); *H01L 2224/92125* (2013.01)

(58) Field of Classification Search
CPC ........... H01L 23/49811; H01L 23/5385; H01L 23/49822; H01L 21/4846; H01L 21/563; H01L 25/105; H01L 2924/15311; H01L 2924/181
See application file for complete search history.

(56) References Cited

U.S. PATENT DOCUMENTS

| | | | |
|---|---|---|---|
| 2008/0272489 A1 | 11/2008 | Fang et al. | |
| 2009/0168367 A1* | 7/2009 | Fujii | H01L 23/3677 361/720 |
| 2014/0063768 A1* | 3/2014 | Tanaka | H05K 1/185 29/830 |
| 2014/0264910 A1* | 9/2014 | Razdan | H01L 23/528 257/774 |
| 2015/0228571 A1* | 8/2015 | Shiraki | H01L 24/97 257/701 |
| 2019/0067199 A1 | 2/2019 | Takizawa et al. | |
| 2020/0043854 A1* | 2/2020 | Oh | H01L 24/16 |
| 2021/0202414 A1 | 7/2021 | Lim et al. | |
| 2021/0225773 A1 | 7/2021 | Bae et al. | |

FOREIGN PATENT DOCUMENTS

| | | |
|---|---|---|
| KR | 1020210082638 A | 7/2021 |
| KR | 1020210094329 A | 7/2021 |

* cited by examiner

SEMICONDUCTOR PACKAGES HAVING FIXING MEMBERS

CROSS-REFERENCE TO THE RELATED APPLICATION

This application claims priority to Korean Patent Application No. 10-2022-0019905, filed on Feb. 16, 2022, in the Korean Intellectual Property Office, the disclosure of which is incorporated herein by reference in its entirety.

BACKGROUND

1. Field

The exemplary embodiments of the disclosure relate to a semiconductor package including a fixing member.

2. Description of the Related Art

In accordance with a tendency of a semiconductor device toward miniaturization, packaging technology for providing a package-on-package (POP) structure in which packages are vertically stacked is used. In accordance with miniaturization of a semiconductor device, reliability of bonding between stacked packages is required.

SUMMARY

The exemplary embodiments of the disclosure provide a semiconductor package including a fixing member including a main opening and a sub-opening connected to the main opening.

A semiconductor package according to exemplary embodiments of the disclosure may include an interposer including an upper pad and an upper passivation layer partially covering the upper pad, a semiconductor chip disposed on the interposer, a conductor pattern disposed on the interposer while contacting the upper pad, a first guide pattern disposed on the interposer, the first guide pattern including a main opening and at least one sub-opening connected to the main opening, a first support disposed on the interposer, the first support including a core portion and a peripheral portion surrounding the core portion, and a lower surface of the first support being disposed in the main opening of the first guide pattern, an upper redistribution structure disposed on the semiconductor chip and connected to the conductor pattern and the first guide pattern, and an encapsulant between the interposer and the upper redistribution structure. The encapsulant may contact an inner wall of the main opening, an inner wall of the at least one sub-opening and a side surface of the first support.

A method for manufacturing a semiconductor package in accordance with exemplary embodiments of the disclosure may include providing an interposer including, at an upper surface thereof, an upper pad and an upper passivation layer partially covering the upper pad, forming, on the interposer, an insulating material to cover the upper passivation layer, patterning the insulating material, thereby forming a guide pattern including, therein, a main opening and at least one sub-opening connected to the main opening, mounting a semiconductor chip on the interposer, stacking an upper redistribution structure connected to a conductor pattern and a support on the interposer and the semiconductor chip, a lower surface of the support being disposed in the main opening, and forming an encapsulant to cover the semiconductor chip, the conductor pattern and the support.

A semiconductor package according to exemplary embodiments of the disclosure may include a lower package, and an upper package on the lower package. The lower package may include an interposer including an upper pad and an upper passivation layer partially covering the upper pad, a lower semiconductor chip disposed on the interposer, a conductor pattern disposed on the interposer while contacting the upper pad, a guide pattern disposed on the interposer, the guide pattern including a main opening and at least one sub-opening connected to the main opening, a support disposed on the interposer, the support including a core portion and a peripheral portion surrounding the core portion, and a lower surface of the support being disposed in the main opening of the guide pattern, an upper redistribution structure disposed on the lower semiconductor chip and connected to the conductor pattern and the guide pattern, and an encapsulant between the interposer and the upper redistribution structure. The encapsulant may contact an inner wall of the main opening, an inner wall of the at least one sub-opening and a side surface of the support.

DETAILED DESCRIPTION OF EXEMPLARY EMBODIMENTS

Figure 1:
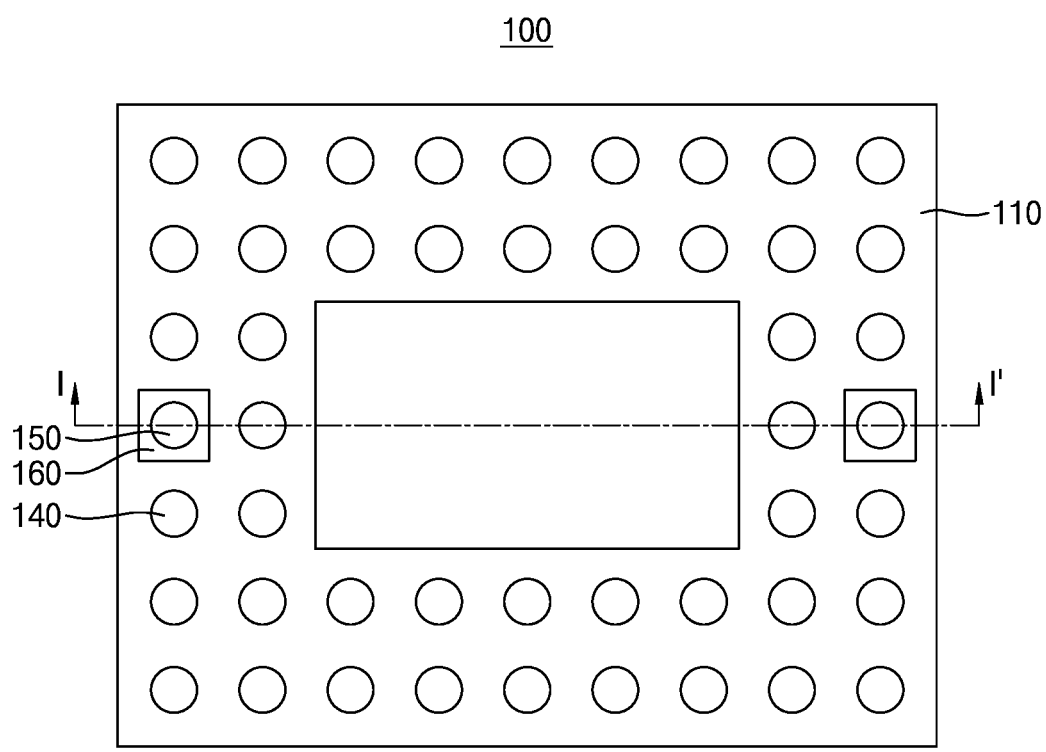
FIG. 1 is a plan view of a semiconductor package according to an exemplary embodiment of the disclosure.
Figure 2:
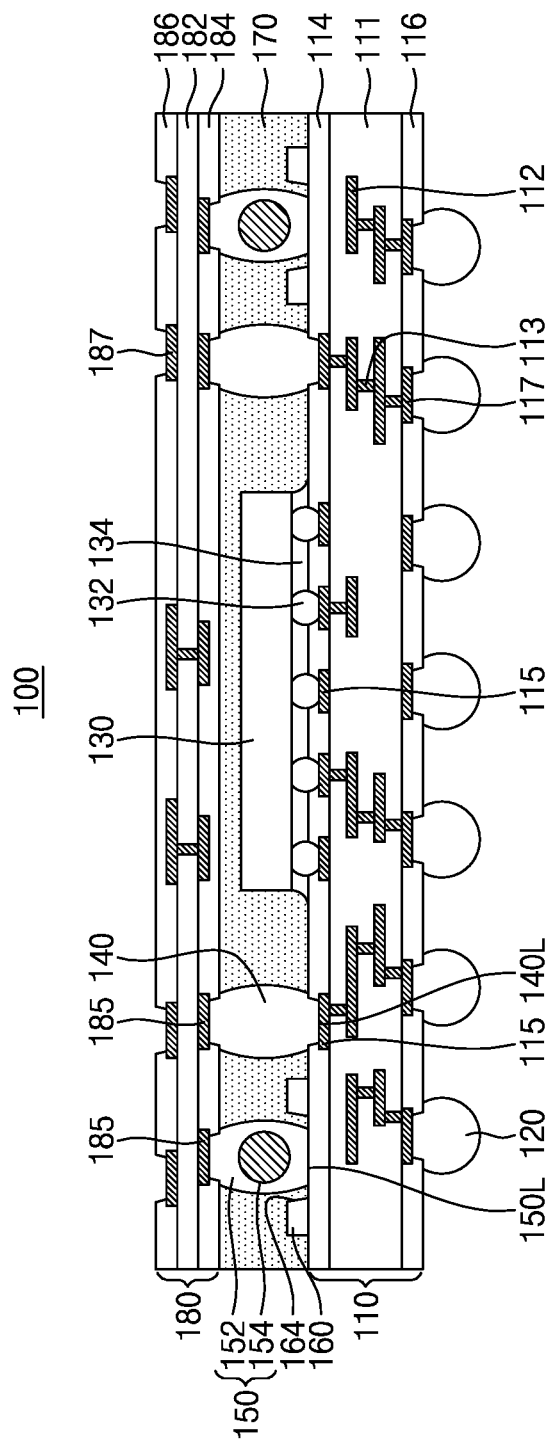
FIG. 2 is a vertical cross-sectional view of the semiconductor package taken along line I-I' in FIG. 1.
Figure 3A:
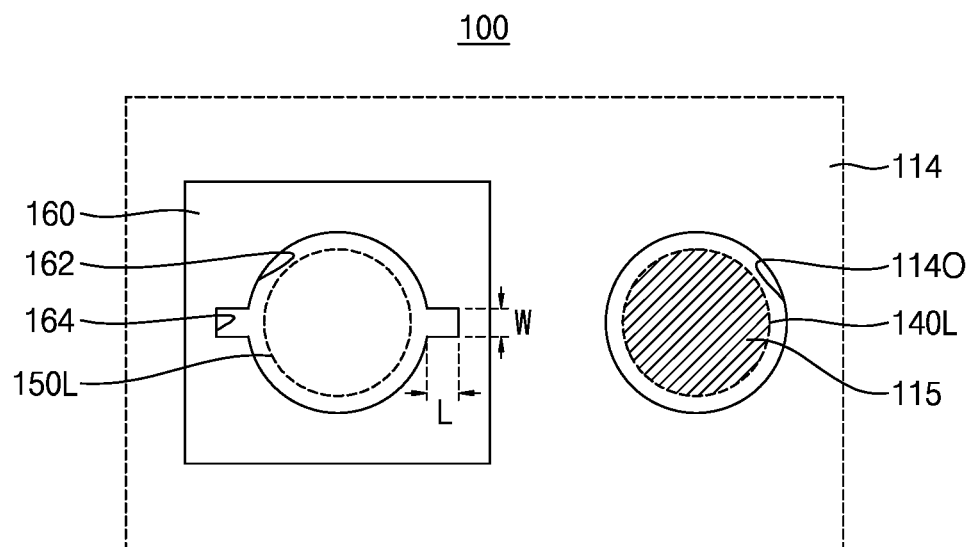
FIG. 3A is an enlarged view of a portion of the semiconductor package shown in FIG. 1.

FIG. 1 is a plan view of a semiconductor package according to an exemplary embodiment of the disclosure. FIG. 2 is a vertical cross-sectional view of the semiconductor package taken along line I-I' in FIG. 1. FIG. 3A is an enlarged view of a portion of the semiconductor package shown in FIG. 1.

Referring to FIGS. 1 and 2, a semiconductor package 100 may include an interposer 110, an outer connection terminal 120, a semiconductor chip 130, a connection member 140, a support member 150, a fixing member 160, an encapsulant 170, and an upper redistribution structure 180. The interposer 110 may include a base layer 111, an upper passivation layer 114 on the base layer 111, and a lower passivation layer 116 under the base layer 111. The base layer 111 may include an insulating material, and may include a wiring layer 112 and a via 113 therein. Wiring layers 112 may be disposed in the form of multiple layers, and vias 113 may interconnect the wiring layers 112 respectively disposed at different layers.

Spatially relative terms, such as "beneath," "below," "lower," "above," "upper," "under" and the like, may be used herein for ease of description to describe positional relationships. It will be understood that the spatially relative terms encompass different orientations of the device in addition to the orientation depicted in the figures.

The insulating material included in the base layer 111 may be a thermosetting resin such as an epoxy resin, a thermoplastic resin such as polyimide, or a resin formed by impregnating a thermosetting resin or a thermoplastic resin into a core such as a glass fiber (glass fiber, glass cloth, or glass fabric) or the like together with an inorganic filler, for example, a prepreg, an Ajinomoto build-up film (ABF), bismaleimide triazine (BT), or the like. The wiring layer 112 and the via 113 may include or be formed of copper (Cu), aluminum (Al), tungsten (W), nickel (Ni), titanium (Ti), titanium nitride (TiN), tantalum (Ta), tantalum nitride (TaN), gold (Au), or a combination thereof.

The upper passivation layer 114 may cover and/or contact an upper surface of the base layer 111. The semiconductor package 100 may further include an upper pad 115 disposed on the base layer 111, and the upper passivation layer 114 may partially cover and/or contact the upper pad 115. The lower passivation layer 116 may cover and/or contact a lower surface of the base layer 111. The semiconductor package 100 may further include a lower pad 117 disposed under/on the base layer 111, and the lower passivation layer 116 may partially cover and/or contact the lower pad 117. The upper pad 115 and the lower pad 117 may be electrically connected to at least one of the wiring layers 112. The upper passivation layer 114 and the lower passivation layer 116 may include or be formed of an insulating material. For example, the upper passivation layer 114 and the lower passivation layer 116 may include or be formed of an organic polymer material. In some embodiments, the upper passivation layer 114 and the lower passivation layer 116 may include photosensitive polyimide (PSPI), an ABF, or a PIE. The upper pad 115 and the lower pad 117 may include or be formed of the same material as the wiring layers 112.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

As used herein, components described as being "electrically connected" are configured such that an electrical signal can be transferred from one component to the other (although such electrical signal may be attenuated in strength as it transferred and may be selectively transferred).

The outer connection terminal 120 may be disposed under the interposer 110. For example, outer connection terminals 120 may contact lower pads 117 corresponding thereto, respectively. The outer connection terminal 120 may be electrically connected to the interposer 110 via the lower pad 117. The outer connection terminal 120 may include or may be formed of a solder. For example, the outer connection terminal 120 may be a solder ball or a solder bump.

The semiconductor chip 130 may be disposed on the interposer 110. The semiconductor chip 130 may include or may be an application processor chip such as a microprocessor, a microcontroller or the like, or a logic chip such as a CPU, a GPU, a modem, an ASIC, an FPGA, or the like. The semiconductor package 100 may further include a bump 132 and an underfill 134 disposed under the semiconductor chip 130. For example, the underfill 134 may be a layer interposed between the semiconductor chip 130 and the upper passivation layer 114. Bumps 132 may contact upper pads 115 corresponding thereto, respectively, and may electrically interconnect the interposer 110 and the semiconductor chip 130. The underfill 134 may fill a space between the interposer 110 and the semiconductor chip 130, and may cover the bump 132. The underfill 134 may protect the bump 132 from external impact. The bump 132 may include or be formed of a solder, and the underfill 134 may include or be formed of a non-conductive paste (NCP), a non-conductive film (NCF), a capillary underfill (CUF), or other insulating materials. For example, the bump 132 may be a solder ball or a solder bump.

The connection member 140 may be disposed on the interposer 110. Referring to FIG. 1, the semiconductor chip 130 may be disposed at a central portion of the interposer 110, and a plurality of connection members 140 may be disposed around the semiconductor chip 130. Referring to FIG. 2, the connection member 140 may have a greater height than the semiconductor chip 130. The connection member 140 may contact the upper pad 115, and may be connected to (e.g., contact) the upper redistribution structure 180. The connection member 140 may include or be formed of a solder and, for example, may include or be formed of tin (Sn), silver (Ag), copper (Cu), palladium (Pd), bismuth (Bi), antimony (Sb), or a combination thereof. For example, the connection members 140 may be conductor patterns and may be formed of one or more conductive materials. For example, the connection members 140 may be a solder ball or a solder bump.

The support member 150 and the fixing member 160 may be disposed on the interposer 110 (e.g., on the upper passivation layer 114). Referring to FIG. 1, support members 150 may be symmetrically disposed with respect to the semiconductor chip 130, and the fixing member 160 may be disposed to surround the support member 150. For example, the support members 150 may be disposed at opposite sides of the semiconductor chip 130. The support member 150 may be electrically connected to the upper redistribution structure 180, but may not be electrically connected to the interposer 110. For example, a lower surface 150L of the support member 150 may not contact the upper pad 115, and may contact an upper surface of the upper passivation layer 114. An upper surface of the support member 150 may be disposed at the same level as an upper surface of the connection member 140, and the lower surface 150L of the support member 150 may be disposed at a higher level than a lower surface 140L of the connection member 140.

The support member 150 may include or be formed of a peripheral portion 152 and a core portion 154 disposed inside the peripheral portion 152. The width and the height of the core portion 154 may be smaller than the width and the height of the connection member 140, respectively. For example, the widths of the core portion 154 and the connection member 140 may be respective maximum distances in a horizontal direction and the heights of the core portion 154 and the connection member 140 may be respective maximum distances in a vertical direction. Since the support member 150 includes the core portion 154, which includes or is formed of a harder material than the connection member 140, the support member 150 may support the upper redistribution structure 180. For example, in a process of forming the semiconductor package 100, the support member 150 may support the upper redistribution structure 180 in order to prevent the connection member 140 from collapsing. The support member 150 may also be used to secure a suitable height between the interposer 110 and the upper redistribution structure 180. The support member 150 may not contact the upper pad 115 in order to prevent generation of a crack at the support member 150 and to enhance freedom of design. In an embodiment, the peripheral portion 152 may include or be formed of the same material as the connection member 140, and the core portion 154 may include or be formed of at least one of nickel (Ni) and copper (Cu). For example, the support members 150 may be supports that support the upper redistribution structure 180 and the supports 150 may be helpful to maintain a predetermined gap between the upper redistribution structure 180 and the interposer 110.

Referring to FIGS. 2 and 3A, the fixing member 160 may be disposed to surround the support member 150. The fixing member 160 may include, therein, a main opening 162 and a sub-opening 164 connected to the main opening 162. The support member 150 may be disposed in the main opening 162. The fixing member 160 may be used to align a position of the support member 150 upon forming the semiconductor package 100. For example, the fixing member 160 may be helpful to align the position of the support member 150 when the interposer 110 and the upper redistribution structure 180 are combined together. An upper surface of the fixing member 160 may be disposed at a lower level than the upper surfaces of the connection member 140 and the support member 150. Although the fixing member 160 is shown in FIG. 1 as being quadrangular, the exemplary embodiments of the disclosure are not limited thereto. In some embodiments, the fixing member 160 may have a different shape such as a triangular shape, a polygonal shape, a circular shape, an oval shape, or the like. The fixing member 160 may include or be formed of the same material as the upper passivation layer 114. In some embodiments, the fixing member 160 may include or be formed of photosensitive polyimide (PSPI), an ABF, or a PIE. For example, the fixing member 160 may be a guide pattern that helps the support member to be placed in a predetermined position, e.g., in the guide pattern (in the fixing member 160). For example, the guide pattern 160 may be an insulator pattern formed of an insulator material. In certain embodiments, the guide pattern 160 may be include or be formed of a conductive material or a semiconductor material.

The encapsulant 170 may be disposed between the interposer 110 and the upper redistribution structure 180. The encapsulant 170 may cover and contact the interposer 110, the semiconductor chip 130, the connection member 140, the support member 150, and the fixing member 160. The encapsulant 170 may also fill the main opening 162 of the fixing member 160 and, for example, may fill the space between the fixing member 160 and the support member 150. The encapsulant 170 may contact an inner wall of the main opening 162 and a side surface of the support member 150. The inner wall of the main opening 162 may face the side surface of the support member 150. The encapsulant 170 may also fill the sub-opening 164, which will be described later, and may contact an inner wall of the sub-opening 164. Inner walls of the sub-opening 164 may face each other. Certain inner walls of the sub-opening 164 may face side surfaces of the support member 150. The encapsulant 170 may be formed of a resin including epoxy, polyimide, or the like. For example, the encapsulant 170 may include or be formed of a bisphenol-group epoxy resin, a polycyclic aromatic epoxy resin, an o-cresol novolac epoxy resin, a biphenyl-group epoxy resin, a naphthalene-group epoxy resin, or the like.

The upper redistribution structure 180 may be disposed at an upper surface of the encapsulant 170. The upper redistribution structure 180 may include an insulating layer 182, a lower passivation layer 184, a connection pad 185, an upper passivation layer 186, and a pad 187. The lower passivation layer 184 and the connection pad 185 may be disposed under the insulating layer 182. The lower passivation layer 184 may cover a lower surface of the insulating layer 182, and may partially cover the connection pad 185. The connection pad 185 may contact the connection member 140 or the support member 150. For example, some connection pads 185 may contact connection members 140 and some other connection pads 185 may contact support members 150. The upper passivation layer 186 and the pad 187 may be disposed on the insulating layer 182. The upper passivation layer 186 may cover an upper surface of the insulating layer 182, and may partially cover the pad 187.

Again referring to FIG. 3A, the upper passivation layer 114 may include an opening 114O, and the opening 114O may expose the upper pad 115. The lower surface 140L of the connection member 140 may be disposed in the opening 114O. For example, the lower surface 140L of the connection member 140 may contact the upper pad 115.

The fixing member 160 may include a main opening 162 and at least one sub-opening 164. As described above, the support member 150 may be disposed in the main opening 162. For example, the lower surface 150L of the support member 150 may be disposed in the main opening 162. For example, the lower surface 150L of the support member 150 may contact an upper surface of the upper passivation layer 114. The sub-opening 164 may be connected to the main opening 162, and may extend in a horizontal direction. For example, the sub-opening 164 may protrude from the main opening 162 in the horizontal direction. For example, the sub-opening 164 may extend in a radial direction from an edge of the main opening 162. In an embodiment, the fixing member 160 may include two sub-openings 164. The two sub-openings 164 may be symmetrically disposed with respect to the main opening 162. Although each of the sub-openings 164 shown in FIG. 3A is rectangular, the exemplary embodiments of the disclosure are not limited thereto. In some embodiments, the sub-opening 164 may have a triangular shape, a polygonal shape, a circular shape, an oval shape, or the like. As shown in FIG. 3A, the sub-opening 164 may be connected to the main opening 162 and, as such, may assist an introduction of the encapsulant 170 into the space between the fixing member 160 and the support member 150. Accordingly, it may be possible to prevent generation of a void caused by incomplete filling of the encapsulant 170 between the fixing member 160 and the support member 150. In an embodiment, the sub-opening 164 may have a length L of 12 μm or more, and may have a width W of 50 to 120 μm. For example, the sub-opening 164 may have a sufficient length L and a sufficient width for the encapsulant 170 to be easily filled between the fixing member 160 and the support member 150. For example, both of the width W and the length L of the sub-opening 164 may be greater than a gap between a side surface of the support member 150 and an inner wall of the main opening 162. For example, the width W of the sub-opening 164 may be a distance between inner walls of the sub-opening 164 facing each other, and the length L of the sub opening may be a distance from an inner wall of the sub-opening 164 facing the support member 150 to its closest part of the inner wall of the main opening 162 in a radial direction with respect to a center of the main opening 162.

Figure 3B:
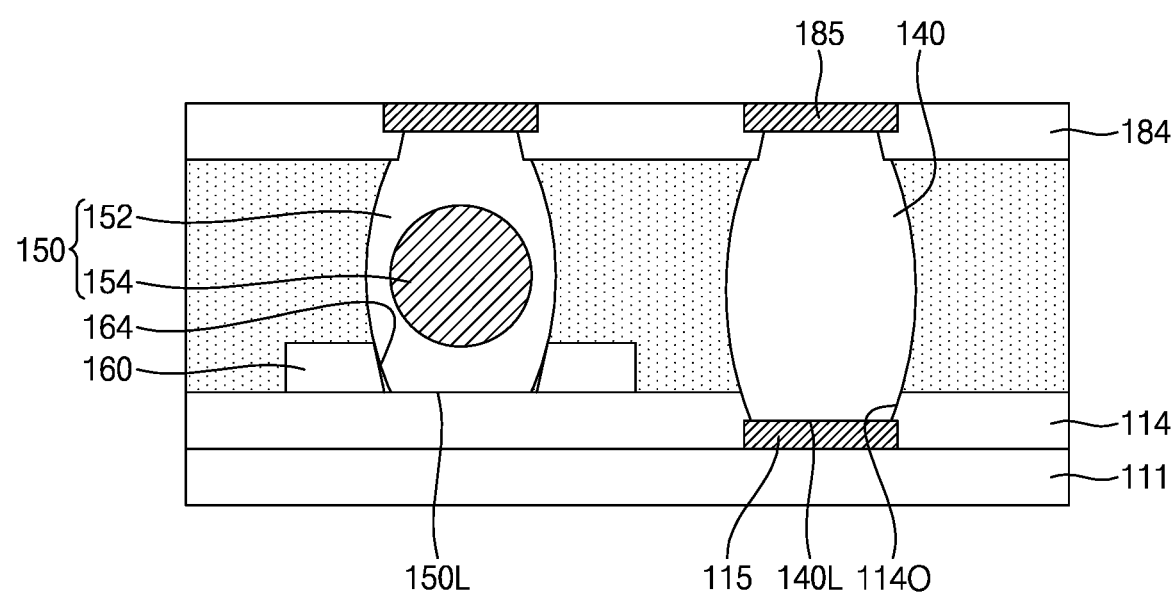
FIG. 3B is a vertical cross-sectional view of the semiconductor package shown in FIG. 1.

FIG. 3B is a vertical cross-sectional view of the semiconductor package shown in FIG. 1.

FIG. 3B shows the support member 150, and the main opening 162 in which the support member 150 is disposed. In an embodiment, the distance between the side surface of the support member 150 and the inner wall of the main opening 162 may be smaller than the distance between the side surface of the support member 150 and the inner wall of the sub-opening 164. For example, the side surface of the support member 150 may contact the inner wall of the main opening 162, and the inner wall of the sub-opening 164 may be spaced apart from the side surface of the support member 150. Since the fixing member 160 includes the sub-opening 164 in accordance with the exemplary embodiment of the disclosure, the encapsulant 170 may be introduced into a space between the support member 150 and the inner wall of the main opening 162 through the sub-opening 164. For example, the support member 150 may contact a part of the inner surface of the main opening 162, and a space may be formed between the support member 150 and another part of the inner surface of the main opening 162. Accordingly, the encapsulant 170 may fill the space between the support member 150 and the main opening 162, and may contact the side surface of the support member 150 and the inner wall of the main opening 162. In some embodiments, the side surface of the support member 150 may not contact the inner wall of the main opening 162, and the encapsulant 170 may fill the space between the support member 150 and the inner wall of the main opening 162.

Figure 4:
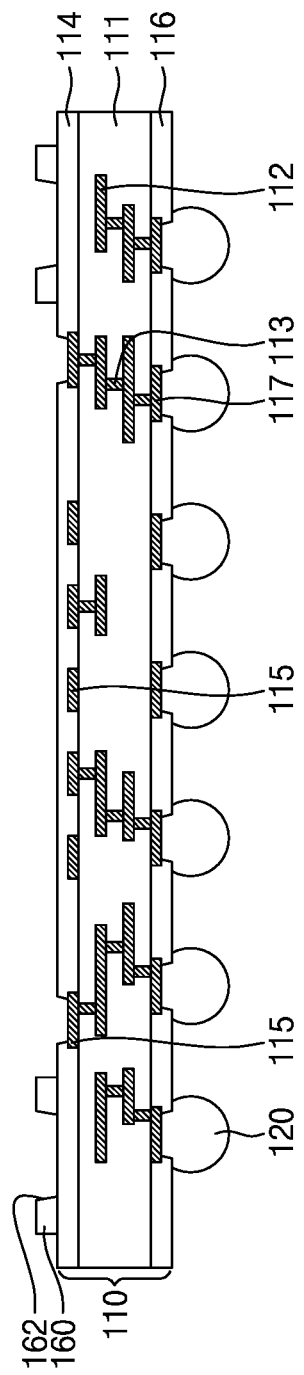
FIGS. 4 to 6 are vertical cross-sectional views shown in accordance with a process sequence in order to explain a method for manufacturing a semiconductor package in accordance with an exemplary embodiment of the disclosure.
Figure 5:
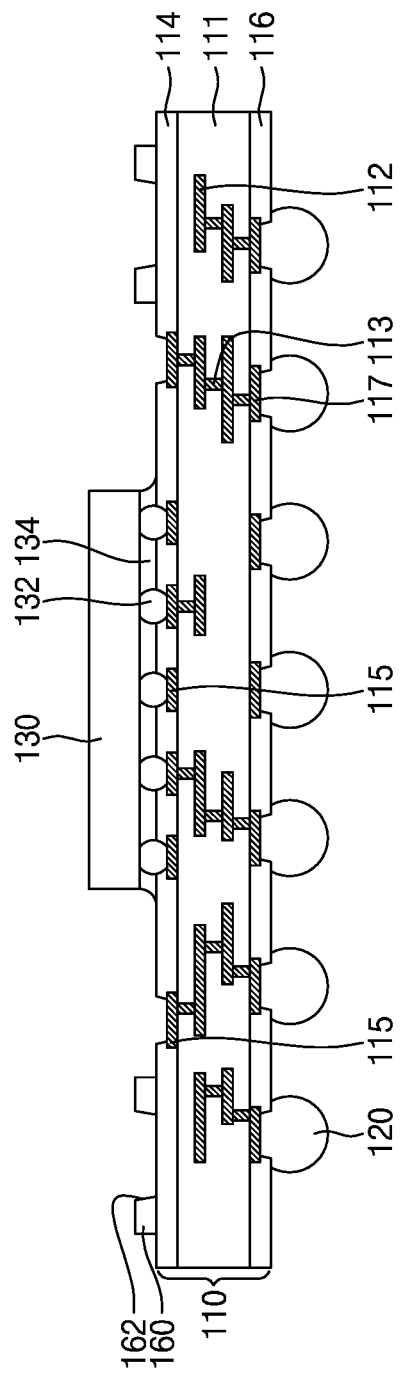
Figure 6:
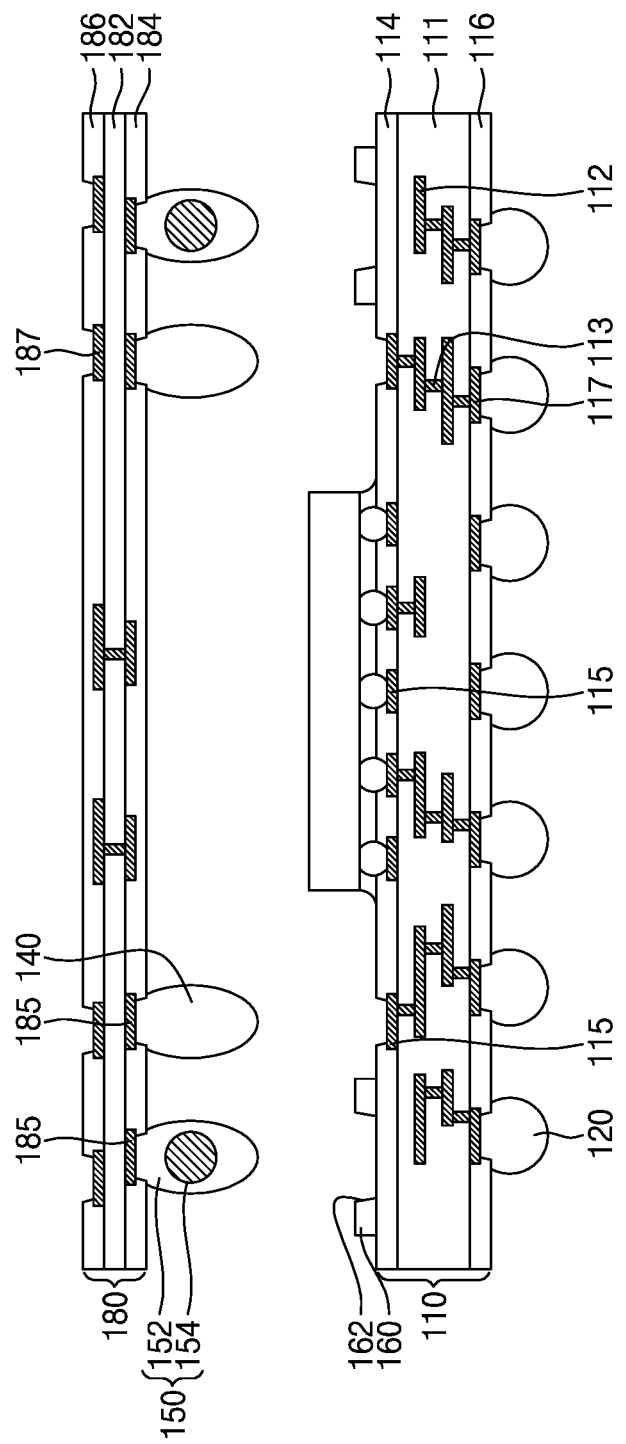

FIGS. 4 to 6 are vertical cross-sectional views shown in accordance with a process sequence in order to explain a method for manufacturing a semiconductor package in accordance with an exemplary embodiment of the disclosure.

Referring to FIG. 4, an interposer 110, an outer connection terminal 120, and a fixing member 160 may be provided. The interposer 110 may include a base layer 111, an upper passivation layer 114 on the base layer 111, and a lower passivation layer 116 under the base layer 111. The upper passivation layer 114 may be formed by forming an insulating material such that the insulating material covers the base layer 111, and then patterning the insulating material such that an upper pad 115 is exposed. A portion of the upper passivation layer 114, at which a support member 150 will be formed, may not be patterned/removed. In some embodiments, the upper passivation layer 114 may include photosensitive polyimide (PSPI), an ABF, or a PIE.

A fixing member 160 may be formed on the interposer 110. The fixing member 160 may be formed by forming an insulating material on the upper passivation layer 114, and then patterning the insulating material. The fixing member 160 may include, therein, a main opening 162 and a sub-opening 164 connected to the main opening 162, and the main opening 162 may surround a position at which the support member 150 will be disposed. For example, the main opening 162 and the sub-opening 164 may be integrally formed such that the main opening 162 and the sub-opening 164 are configured to be in fluid communication. The upper passivation layer 114 may not be etched by the above-described patterning.

Referring to FIG. 5, a semiconductor chip 130 may be mounted on the resultant structure of FIG. 4. The semiconductor chip 130 may be mounted through flip chip bonding, and a bump 132 under the semiconductor chip 130 may contact the upper pad 115. An underfill 134 may be formed to fill a space between the semiconductor chip 130 and the interposer 110, and may cover/encapsulate bumps 132. Although one semiconductor chip 130 is illustrated in FIG. 5, a plurality of semiconductor chips 130 may be mounted on the interposer 110. For example, the plurality of semiconductor chips 130 may be mounted on the interposer 110 together thereby manufacturing a plurality of semiconductor packages 100 together after a singulation process in a later step.

Referring to FIG. 6, a connection member 140, the support member 150, and an upper redistribution structure 180 may be stacked on the resultant structure of FIG. 5. The connection member 140 and the support member 150 may be connected to the upper redistribution structure 180 and, for example, may contact connection pads 185 formed at a lower surface of the upper redistribution structure 180, respectively. The connection member 140 may contact the upper pad 115 of the interposer 110, and the support member 150 may be disposed in the main opening 162 of the fixing member 160. The fixing member 160 may align a position of the support member 150, and the support member 150 may prevent the connection member 140 from being damaged during attachment of the connection member 140. For example, the fixing member 160 may be helpful for aligning the support member 150, the connection member 140, and the upper redistribution structure 180 with the interposer 110 during the attachment process thereby preventing/reducing damage to the connection member 140.

After attachment of the connection member 140 and the support member 150, an encapsulant 170 (cf. FIG. 2) may be formed between the interposer 110 and the upper redistribution structure 180. The encapsulant 170 may be formed by injecting an insulating material between the interposer 110 and the upper redistribution structure 180. As described with reference to FIG. 3, the encapsulant 170 may completely fill a space between the fixing member 160 and the support member 150 because the fixing member 160 includes the sub-opening 164 connected to the main opening 162. Accordingly, it may be possible to prevent generation of a void between the fixing member 160 and the support member 150. After formation of the encapsulant 170, the interposer 110 may be cut such that the plurality of semiconductor chips 130 disposed on the interposer 110 is singulated and, as such, the semiconductor package 100 shown in FIG. 2 may be formed/obtained.

Figure 7:
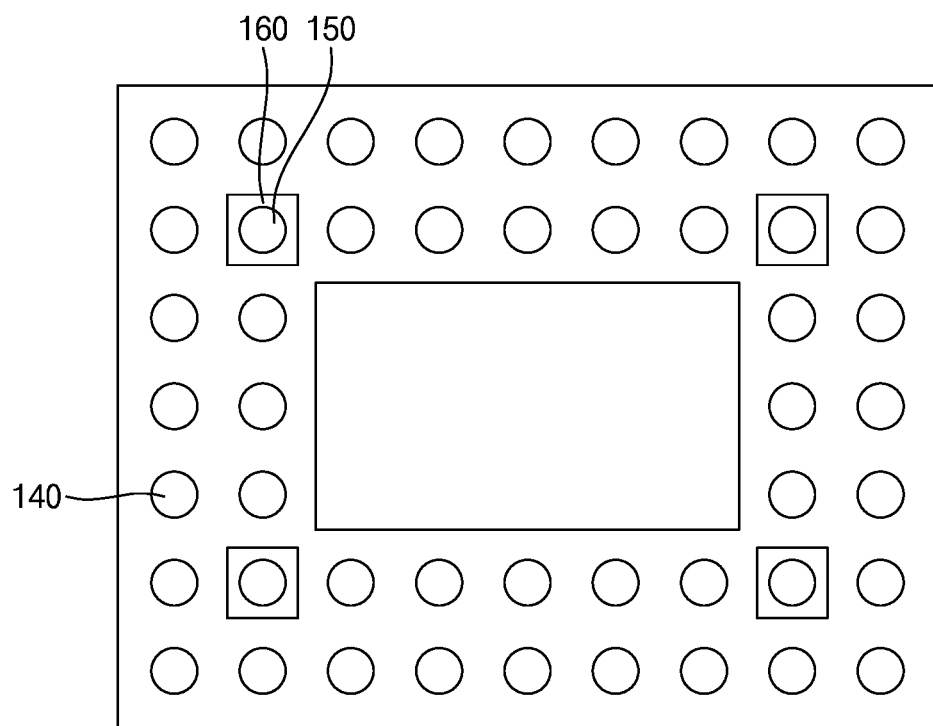
FIG. 7 is a plan view of a semiconductor package according to an embodiment.

FIG. 7 is a plan view of a semiconductor package according to an embodiment.

Referring to FIG. 7, in an embodiment, fixing members 160 may be symmetrically disposed with respect to a semiconductor chip 130. For example, four fixing members 160 may be disposed adjacent to respective corners of the semiconductor chip 130. For example, no connection member 140 may be disposed between each fixing member 160 and its corresponding corner of the semiconductor chip 130. For example, one fixing member 160 may disposed next to and spaced apart from each of the four corners of the semiconductor chip 130, e.g., in a diagonal direction as shown in FIG. 7. A support member 150 may be disposed to be positioned in a main opening 162 of each of the fixing members 160. FIG. 7 shows an illustrative disposition method of the fixing member 160 and, in some embodiments, a plurality of fixing members 160 may be disposed adjacent to one another, e.g., with no connection member 140 between the fixing members 160. Alternatively, in some embodiments, one fixing member 160 may include a plurality of main openings 162, and a plurality of support members 150 may be disposed in the main openings 162, respectively.

FIGS. 8A to 8D are plan views of semiconductor packages according to exemplary embodiments of the disclosure, respectively.

Figure 8A:
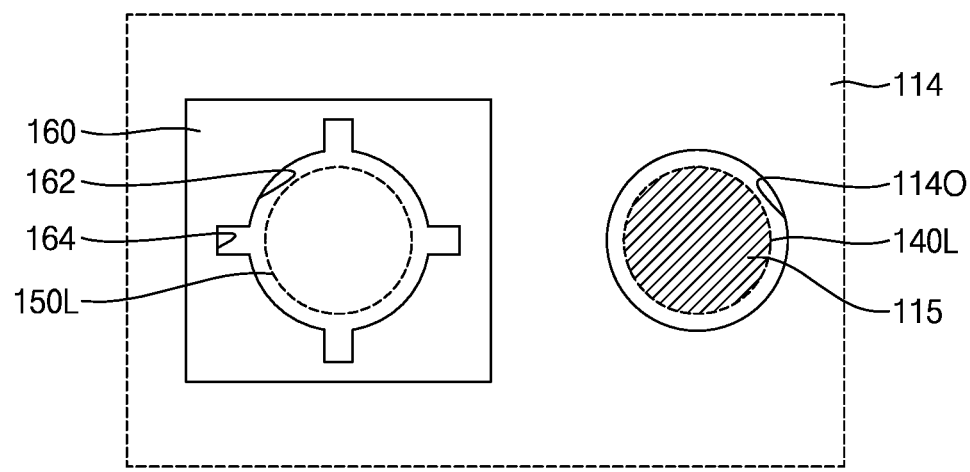
FIGS. 8A to 8D are plan views of semiconductor packages according to exemplary embodiments of the disclosure, respectively.

Referring to FIG. 8A, a fixing member 160 may include a main opening 162 and four sub-openings 164 connected to the main opening 162. The sub-openings 164 may be spaced apart from one another by a uniform distance along a circumference of the main opening 162. For example, the sub-openings 164 may be spaced apart from each other in a circumferential direction by the same distance. For example, two pairs of sub-openings 164 may be disposed to face each other. For example, each pair of sub-openings 164 may face each other. For example, each pair of sub-openings may be disposed opposite each other with respect to the main opening 162 and/or with respect to the support member 150 disposed in the main opening 162.

Figure 8B:
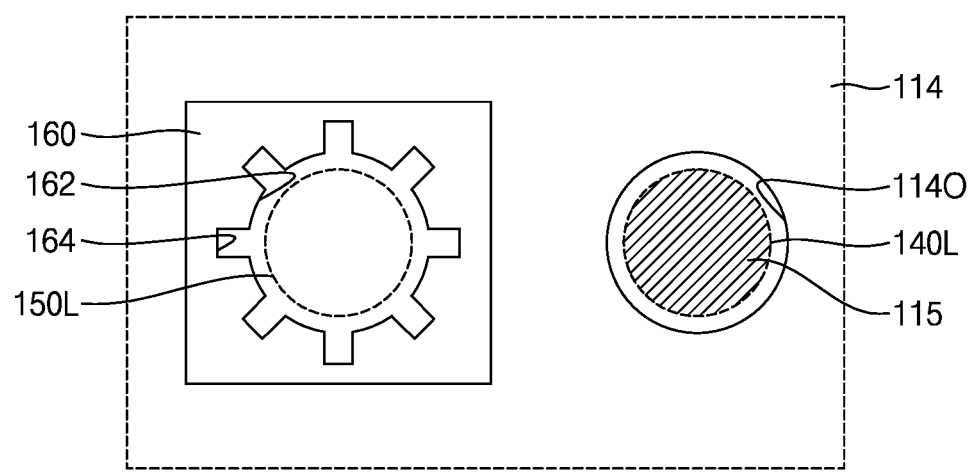

Referring to FIG. 8B, a fixing member 160 may include a main opening 162 and eight sub-openings 164 connected to the main opening 162. The sub-openings 164 may be spaced apart from one another by a uniform distance along a circumference of the main opening 162. For example, the eight sub-openings 164 may be spaced apart from each other in a circumferential direction by the same distance. For example, four pairs of sub-openings 164 may be disposed to face each other. For example, each pair of sub-openings 164 may face each other. For example, each pair of sub-openings may be disposed opposite each other with respect to the main opening 162 and/or with respect to the support member 150 disposed in the main opening 162. FIGS. 8A and 8B show illustrative sub-openings 164 and, in some embodiments, a smaller or greater number of sub-openings 164 may be disposed.

Figure 8C:
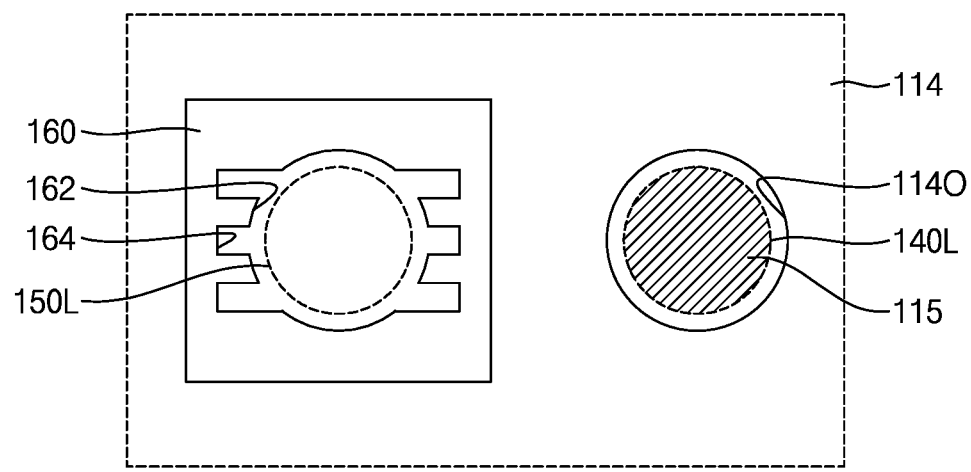

Referring to FIG. 8C, a fixing member 160 may include a main opening 162 and six sub-openings 164 connected to the main opening 162. For example, the main opening 162 and the sub-openings 164 may be integrally formed such that the main opening 162 and the sub-openings 164 are configured to be in fluid communication. The sub-openings 164 may extend in the same direction, and three pairs of sub-openings 164 may be symmetrically disposed with respect to the main opening 162. For example, the sub-openings 164 extending in the direction may be beneficial when the encapsulant 170 is provided in the direction which the sub-openings 164 extend.

Figure 8D:
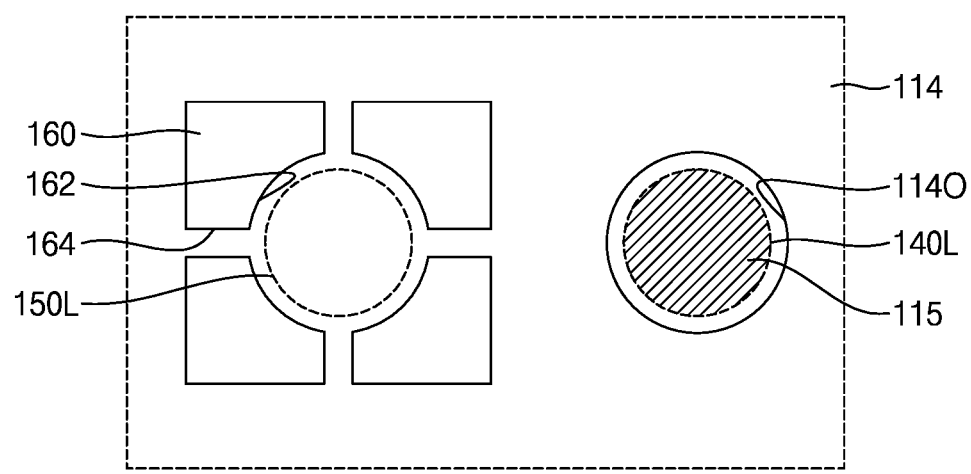

Referring to FIG. 8D, a fixing member 160 may include a main opening 162 and four sub-openings 164 connected to the main opening 162. In an embodiment, the sub-openings 164 may divide the fixing member 160 into several pieces. For example, the sub-openings 164 may allow the main opening 162 to communicate with an exterior of the fixing member 160. In addition, the sub-openings 164 may be spaced apart from one another by a uniform distance along a circumference of the main opening 162 (e.g., in a circumferential direction).

FIGS. 9A to 9E are plan views of semiconductor packages according to exemplary embodiments of the disclosure, respectively.

Figure 9A:
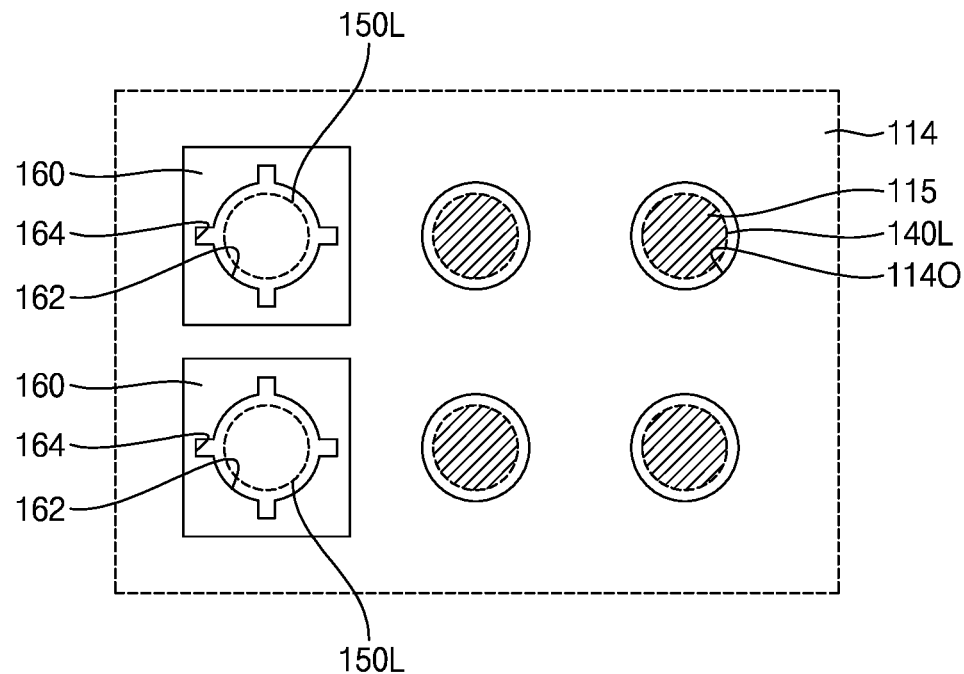
FIGS. 9A to 9E are plan views of semiconductor packages according to exemplary embodiments of the disclosure, respectively.

Referring to FIG. 9A, a plurality of fixing members 160 may be disposed adjacent to one another, e.g., with no connection member 140 between the fixing members 160. Each fixing member 160 may include a main opening 162 and at least one sub-opening 164. Support members 150 may be disposed in respective main openings 162. Although the fixing member 160 is shown as being identical to the fixing member 160 shown in FIG. 8A, the exemplary embodiments of the disclosure are not limited thereto. In some embodiments, the fixing member 160 may be identical to or different from the fixing members 160 shown in FIGS. 8B to 8D. Although FIG. 9A shows that two fixing members 160 disposed adjacent to each other have the same structure, the exemplary embodiments of the disclosure are not limited thereto.

Figure 9B:
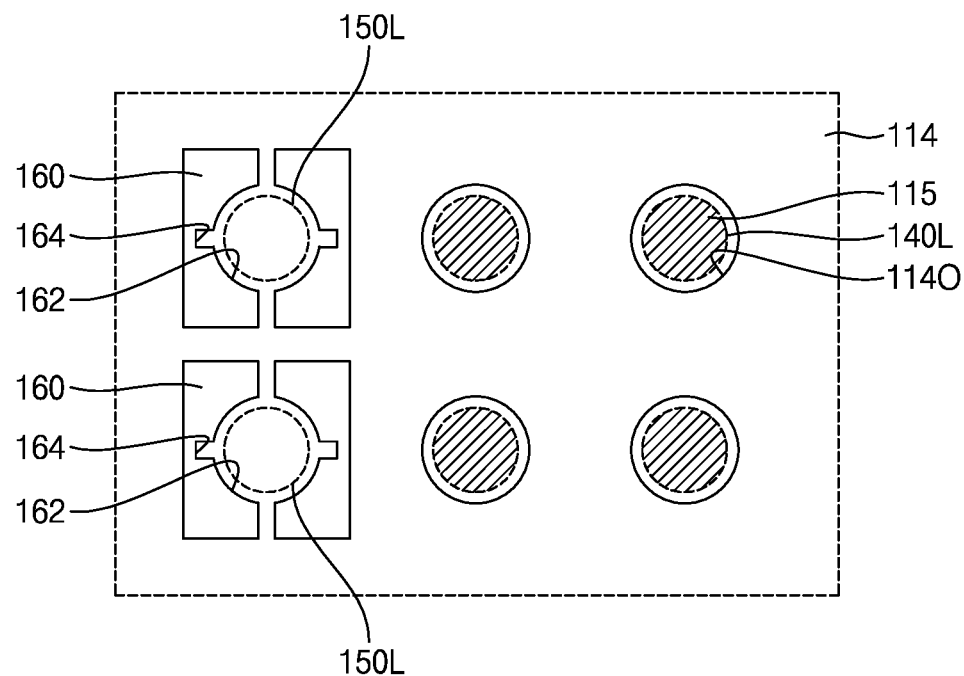

Referring to FIG. 9B, a plurality of fixing members 160 may be disposed adjacent to one another, e.g., without any connection member 140 between the fixing members 160. In an embodiment, at least one fixing member 160 may include at least one sub-opening 164 dividing the fixing member 160. For example, the at least one sub-opening 164 may allow a main opening 162 to communicate with an exterior of the fixing member 160. As shown in FIG. 9B, each fixing member 160 may include sub-openings 164 allowing a main opening 162 to communicate with an exterior of the fixing member 160, and the sub-openings 164 may extend in the same direction. For example, each of the main openings 162 may be configured to be in fluid communication with an outside of the main opening 162 through one or more sub-openings 164.

Figure 9C:
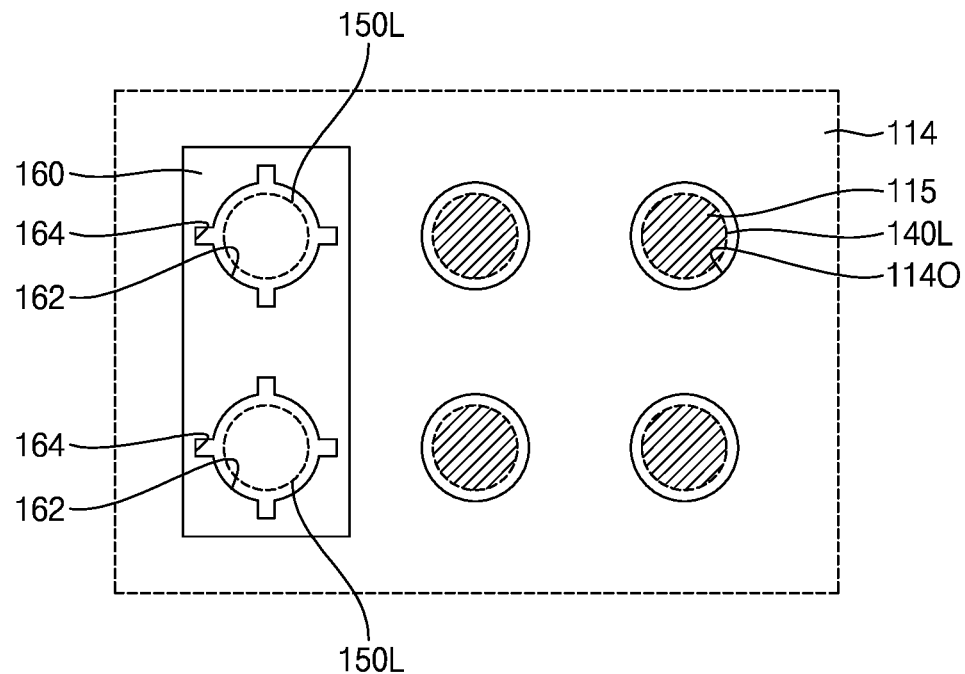

Referring to FIG. 9C, a plurality of support members 150 may be disposed adjacent to one another, and a fixing member 160 may be disposed to extend over the entirety of the plurality of support members 150. For example, the plurality of support members 150 may be disposed in the same fixing member 160. For example, the fixing member 160 may include main openings 162 corresponding in number to the plurality of support members 150, and the support members 150 may be disposed in corresponding ones of the main openings 162, respectively. The fixing member 160 may include at least one sub-opening 164 connected to each main opening 162. Although the main openings 162 are shown in FIG. 9C as not communicating with one another, the exemplary embodiments of the disclosure are not limited thereto.

Figure 9D:
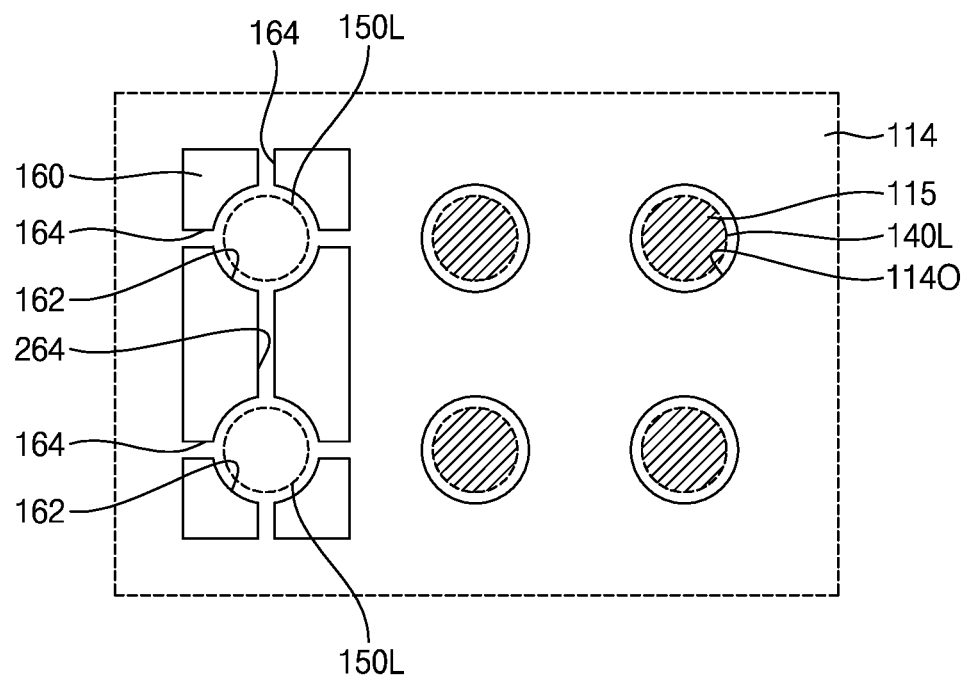

Referring to FIG. 9D, a plurality of support members 150 may be disposed adjacent to one another, and the plurality of support members 150 may be disposed in the same fixing member 160. In an embodiment, the fixing member 160 may include a plurality of main openings 162, and may also include a connection passage 264 interconnecting the plurality of main openings 162 to each other. For example, the fixing member 160 may include one or more connection passages 264 and each connection passage 264 may interconnect two or more main openings 162. Although the connection passage 264 in FIG. 9D is shown as having the same width as sub-openings 164, the exemplary embodiments of the disclosure are not limited thereto. For example, the widths of the sub-openings 164 may be different from the widths of the connection passages 264. For example, the different widths between the sub-openings 164 and the connection passages 264 may be helpful to optimize flow speeds of the encapsulant 170 during the manufacturing process. For example, the widths of the connection passages 264 may be greater than the widths of the sub-openings 164.

In some embodiments, the sub-openings 164 may allow the main openings 162 to communicate with an exterior of the fixing member 160.

Figure 9E:
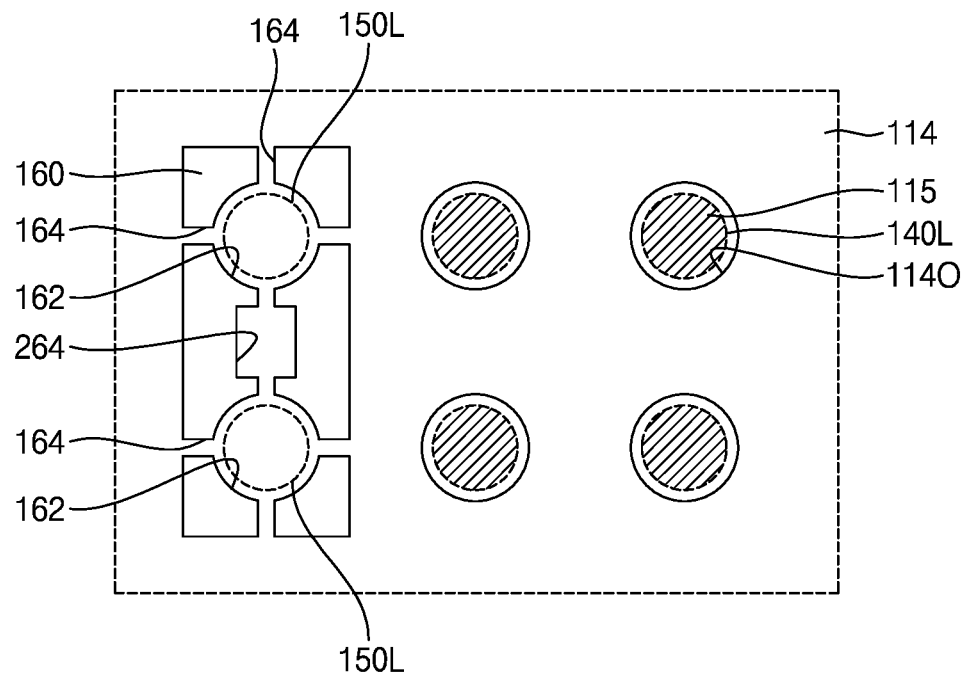

Referring to FIG. 9E, a plurality of support members 150 disposed adjacent to one another may be disposed in the same fixing member 160. The fixing member 160 may include a connection passage 264 interconnecting a plurality of main openings 162. In an embodiment, the connection passage 264 may have a greater width than at least one of sub-openings 164. For example, a portion of the connection passage 264 may have a greater width than at least one of the sub-openings 164. In some embodiments, the connection passage 264 may have a uniform width, e.g., with a greater width than at least one of the sub-openings 164.

Figure 10:
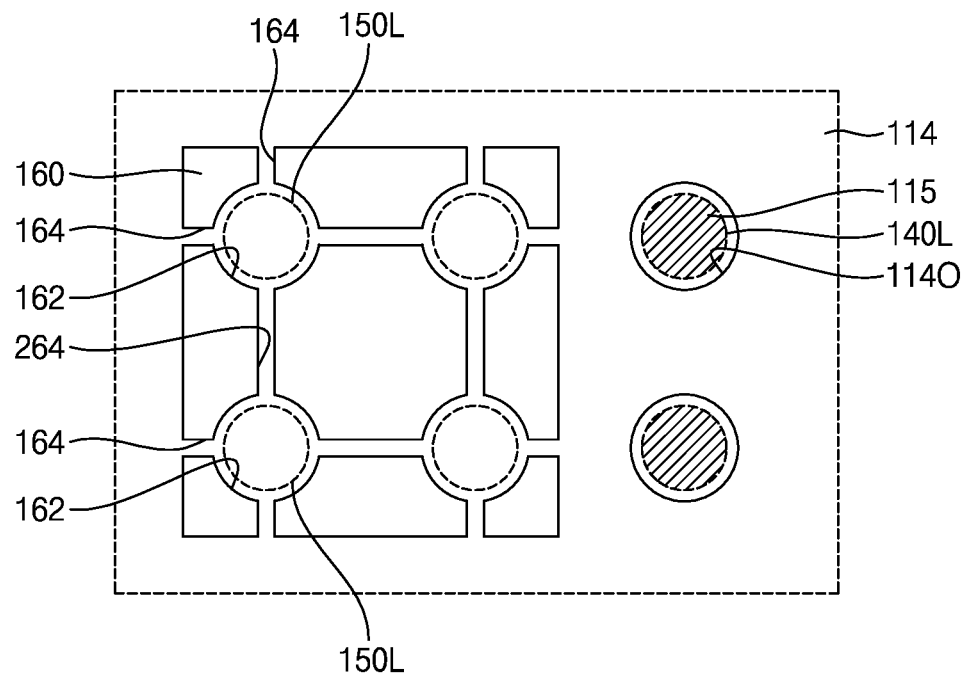
FIG. 10 is a plan view of a semiconductor package according to an exemplary embodiment of the disclosure.

FIG. 10 is a plan view of a semiconductor package according to an exemplary embodiment of the disclosure.

Referring to FIG. 10, a plurality of support members 150 disposed adjacent to one another may be disposed in the same fixing member 160. For example, four support members 150 may be disposed adjacent to one another, and one fixing member 160 may be disposed to extend over the entirety of the four support members 150. For example, the fixing member 160 may include four main openings 162, and the support members 150 may be disposed in corresponding ones of the main openings 162, respectively. The fixing member 160 may further include connection passages 264 interconnecting the main openings 162. For example, four connection passages 264 may interconnect four adjacent main openings 162.

Figure 11:
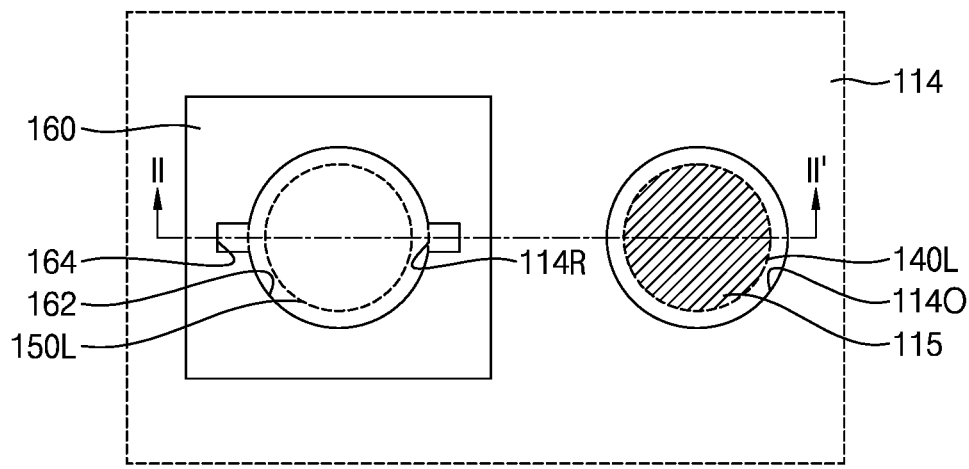
FIG. 11 is a plan view of a semiconductor package according to an exemplary embodiment of the disclosure.
Figure 12:
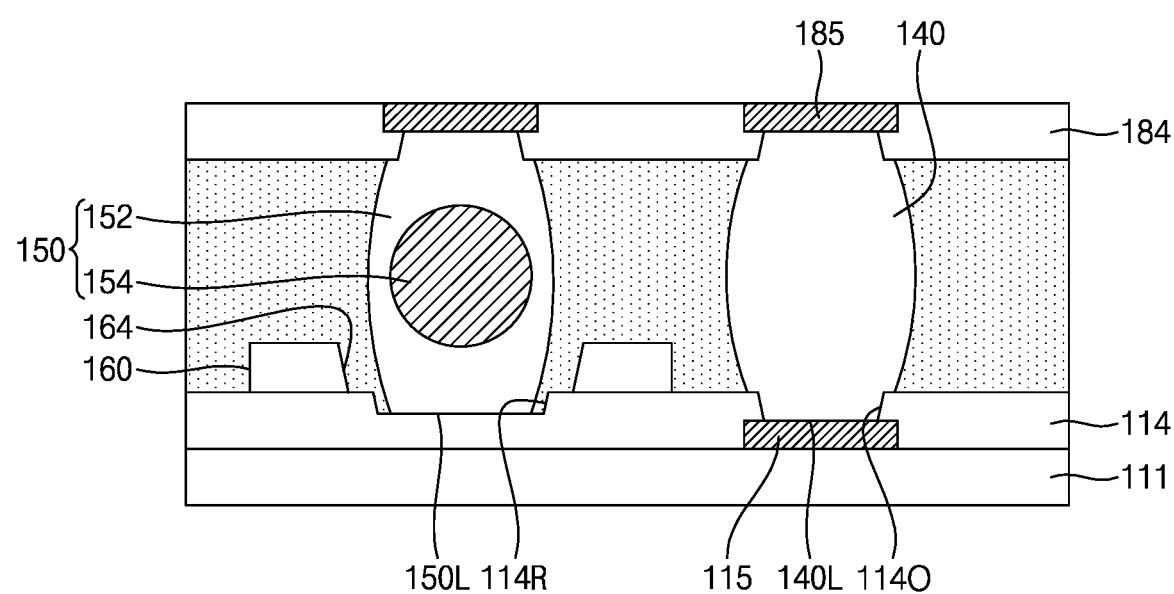
FIG. 12 is a vertical cross-sectional view of the semiconductor package taken along line II-II' in FIG. 11.

FIG. 11 is a plan view of a semiconductor package according to an exemplary embodiment of the disclosure. FIG. 12 is a vertical cross-sectional view of the semiconductor package taken along line II-II' in FIG. 11.

Referring to FIGS. 11 and 12, in an embodiment, an upper passivation layer 114 may include a recessed region 114R. The recessed region 114R may be formed along a main opening 162 of a fixing member 160. For example, the recessed region 114R may be formed by etching a portion of the upper passivation layer 114 corresponding to the main opening 162. A support member 150 may be disposed in the recessed region 114R. For example, a lower surface 150L of the support member 150 may contact the recessed region 114R, e.g., may contact a surface of the upper passivation layer 114 in the recessed region 114R. Although the recessed region 114R is shown in FIG. 11 as having the same size as the main opening 162, the exemplary embodiments of the disclosure are not limited thereto. In some embodiments, the recessed region 114R may have a smaller size than the main opening 162, e.g., in a plan view. The recessed region 114R may expose a side surface of the support member 150, and may enlarge a space between the fixing member 160 and the support member 150. Accordingly, the recessed region 114R may assist in introduction of an encapsulant 170 into the space between the fixing member 160 and the support member 150 and, as such, may prevent generation of a void. The encapsulant 170 may contact an upper surface of the upper passivation layer 114 in the recessed region 114R. For example, the encapsulant 170 and the support member 150 may contact a bottom surface of the recessed region 114R as shown in FIG. 12. The encapsulant 170 may contact side surfaces of the recessed region 114R. The support member 150 may support an upper redistribution structure 180 (cf. FIG. 2) in order to prevent a connection member 140 from collapsing. In this regard, the support member 150 may be disposed at a higher level than the connection member 140. For example, an upper surface of the support member 150 and an upper surface of the connection member 140 may be disposed at the same level (the same level as a lower surface of a connection pad 185), but the lower surface 150L of the support member 150 may be disposed at a higher level than a lower surface of the connection member 140. For example, the recessed region 114R may be disposed at a higher level than an upper surface of the upper pad 115. For example, the connection member 140 may have a greater height than the support member 150.

Figure 13:
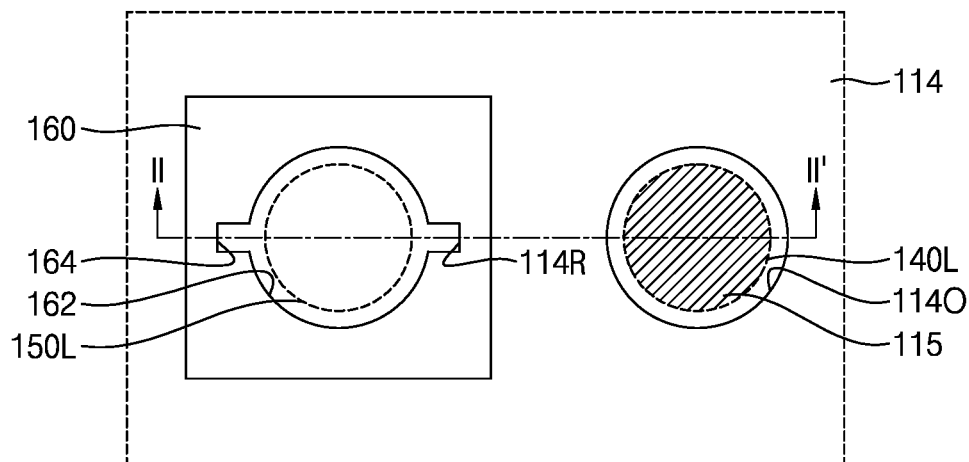
FIG. 13 is a plan view of a semiconductor package according to an exemplary embodiment of the disclosure.
Figure 14:
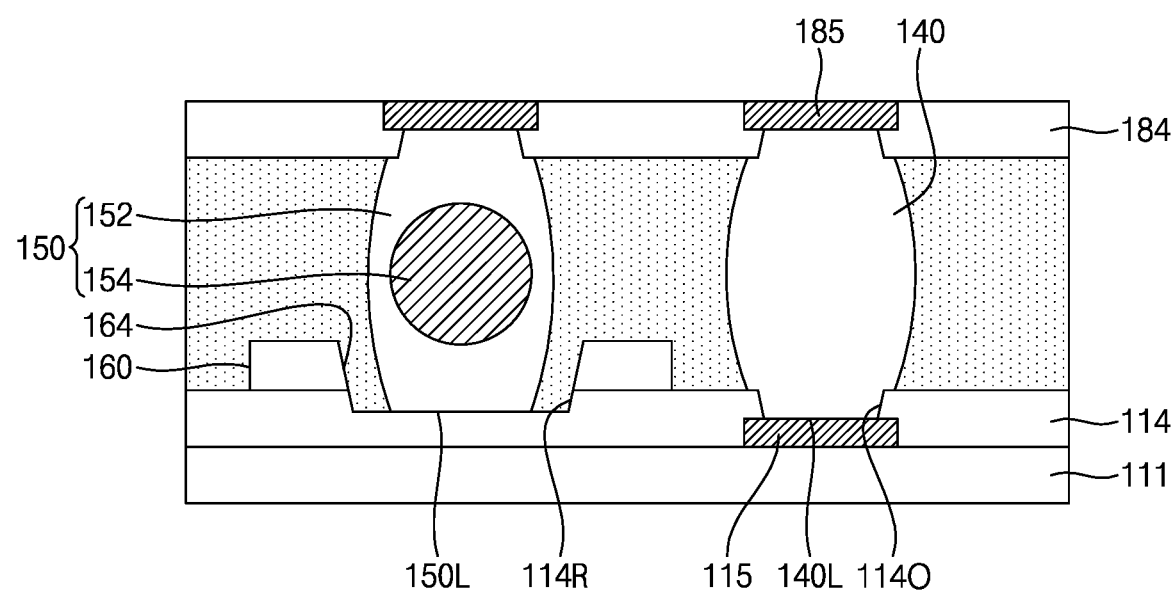
FIG. 14 is a vertical cross-sectional view of the semiconductor package taken along line II-II' in FIG. 13.

FIG. 13 is a plan view of a semiconductor package according to an exemplary embodiment of the disclosure. FIG. 14 is a vertical cross-sectional view of the semiconductor package taken along line II-II' in FIG. 13.

Referring to FIGS. 13 and 14, an upper passivation layer 114 may include a recessed region 114R formed along a main opening 162 and a sub-opening 164 of a fixing member 160. For example, the recessed region 114R may be similar to the recessed region 114R shown in FIGS. 11 and 12, but may further extend along the sub-opening 164. The recessed region 114R may be formed by etching a portion of the upper passivation layer 114 corresponding to the main opening 162 and the sub opening 164. A support member 150 may be disposed in the recessed region 114R.

Figure 15:
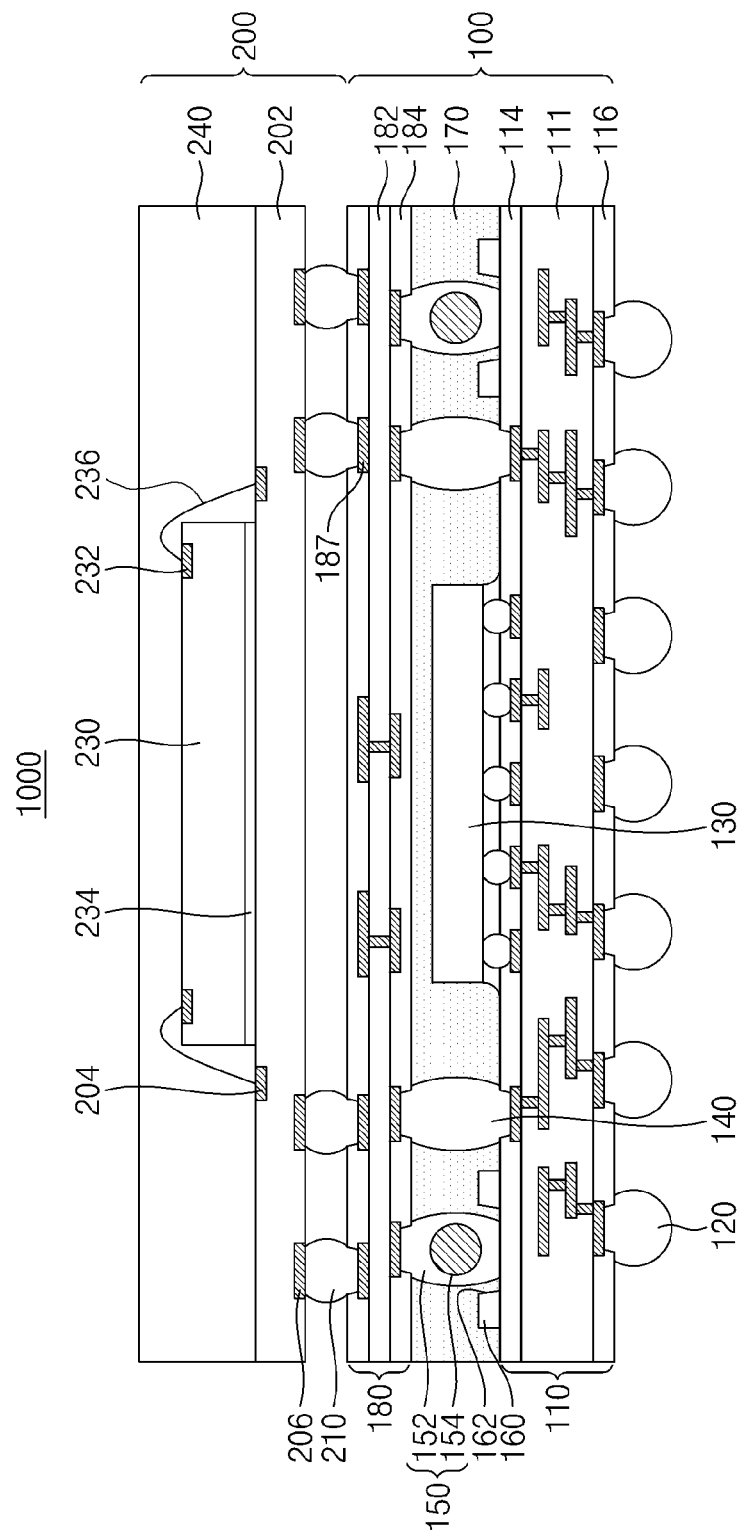
FIGS. 15 and 16 are vertical cross-sectional views of semiconductor packages according to exemplary embodiments of the disclosure, respectively.
Figure 16:
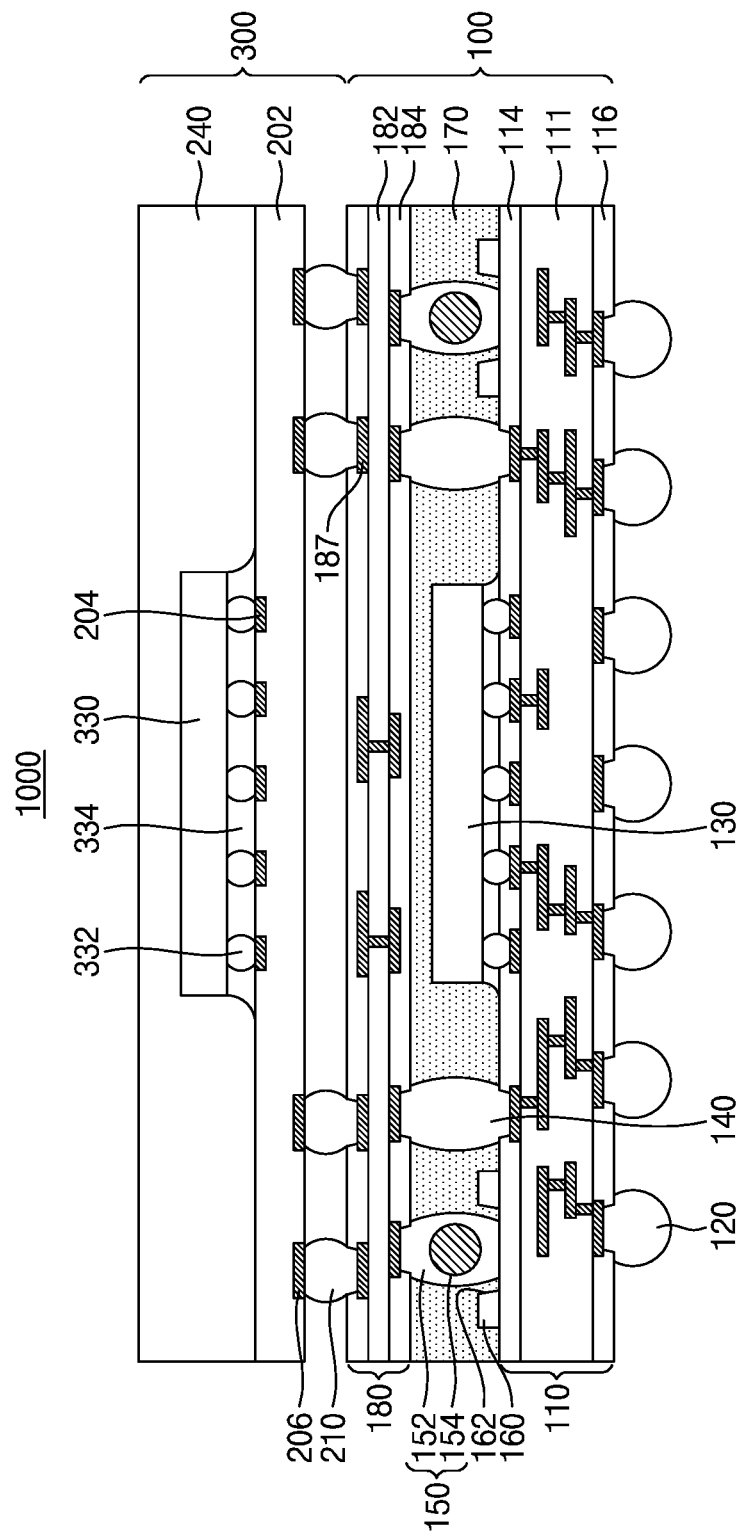

FIGS. 15 and 16 are vertical cross-sectional views of semiconductor packages according to exemplary embodiments of the disclosure, respectively.

Referring to FIG. 15, a semiconductor package 1000 may have a package-on-package structure. For example, the semiconductor package 1000 may include a lower package 100 and an upper package 200 on the lower package 100. The lower package 100 may have a structure identical or similar to the semiconductor package 100 described with reference to FIGS. 1 to 3. The lower package 100 has features/characteristics of the semiconductor package 100 described with reference to FIGS. 1 to 3 and, as such, no detailed description thereof will be given. A semiconductor chip 130 of the lower package 100 may be referred to as a "lower semiconductor chip".

The upper package 200 may include a substrate 202, a package connection terminal 210, an upper semiconductor chip 230, an adhesive member 234, a bonding wire 236, and an encapsulant 240. The substrate 202 may include upper pads 204 and lower pads 206. In an embodiment, the substrate 202 may be a printed circuit board, and may include an insulating material such as a phenolic resin, an epoxy resin, a prepreg, or the like. In another embodiment, the substrate 202 may be a redistribution layer in which an insulating material and a conductive material are stacked. The upper pads 204 and the lower pads 206 may be formed by forming a metal layer on a base (e.g., on an insulator layer) of the substrate 202, and then patterning the metal layer. Although not shown, a solder resist layer may be disposed at an upper surface and a lower surface of the substrate 202, and may partially cover the upper pads 204 and the lower pads 206.

The upper pads 204 may be disposed at the upper surface of the substrate 202, and may be electrically connected to the upper semiconductor chip 230. The lower pads 206 may be disposed at the lower surface of the substrate 202, and at least one lower pad 206 may be electrically connected to the upper pad 204 corresponding thereto. Package connection terminals 210 may contact pads 187 of an upper redistribution structure 180, respectively. The package connection terminal 210 may electrically interconnect the upper package 200 and the lower package 100.

The lower pad 206 and the upper pad 204 may include or be formed of a metal such as aluminum (Al), titanium (Ti), chromium (Cr), iron (Fe), cobalt (Co), nickel (Ni), copper (Cu), zinc (Zn), palladium (Pd), platinum (Pt), gold (Au), and silver (Ag). The package connection terminal 210 may be a solder bump.

The upper semiconductor chip 230 may be mounted on the substrate 202. The lower semiconductor chip 130 of the lower package 100 and the upper semiconductor chip 230 of the upper package 200 may be semiconductor devices of different kinds, respectively. For example, the lower semiconductor chip 130 may include or may be an application processor chip such as a microprocessor, a microcontroller or the like, or a logic chip such as a CPU, a GPU, a modem, an ASIC, an FPGA, or the like. The upper semiconductor chip 230 may include or may be a volatile memory such as DRAM or a non-volatile memory such as flash memory. The upper semiconductor chip 230 may be mounted on the substrate 202 through wire bonding. For example, the upper semiconductor chip 230 may include chip pads 232 at an upper surface thereof, and the chip pads 232 may be electrically connected to the upper pads 204 by bonding wires 236. The upper semiconductor chip 230 may be electrically connected to the upper redistribution structure 180. For example, the upper semiconductor chip 230 may be electrically connected to the upper redistribution structure 180 via the package connection terminal 210 and the substrate 202.

The adhesive member 234 may be disposed between the substrate 202 and the upper semiconductor chip 230, and may fix the upper semiconductor chip 230 to the substrate 202. The adhesive member 234 may be a die attach film (DAF), without being limited thereto. The encapsulant 240 may cover the upper semiconductor chip 230 and the bonding wire 236. The encapsulant 240 may include or be formed of an epoxy resin.

Referring to FIG. 16, a semiconductor package 1000 may include a lower package 100 and an upper package 300 on the lower package 100. The upper package 300 may include an upper semiconductor chip 330, a bump 332, and an underfill 334. In an embodiment, the upper semiconductor chip 330 may be mounted on a substrate 202 through flip chip bonding. Bumps 332 may be disposed at a lower surface of the upper semiconductor chip 330, and may contact upper pads 204. The underfill 334 may be disposed between the substrate 202 and the upper semiconductor chip 330, and may cover/surround/contact the bumps 332. The underfill 334 may include or be formed of a non-conductive paste (NCP), a non-conductive film (NCF), a capillary underfill (CUF), or other insulating materials.

In accordance with the exemplary embodiments of the disclosure, a fixing member may include a main opening in which a support member is disposed, and a sub-opening connected to the main opening and, as such, it may be possible to prevent generation of a void between the fixing member and the support member.

Though different figures show variations of exemplary embodiments, these FIGS. are not necessarily intended to be mutually exclusive from each other. Rather, as recognized from the context of the detailed description above, certain features depicted in different figures and/or described above can be combined with other features from other figures/embodiments to result in additional various embodiments, when taking the figures and related descriptions as a whole into consideration.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
   an interposer comprising an upper pad and an upper passivation layer partially covering the upper pad;
   a semiconductor chip disposed on the interposer;
   a conductor pattern disposed on the interposer and contacting the upper pad;
   a first guide pattern disposed on the interposer, the first guide pattern comprising a main opening and at least one sub-opening connected to the main opening;
   a first support disposed on the interposer, the first support comprising a core portion and a peripheral portion surrounding the core portion, and a lower surface of the first support being disposed in the main opening of the first guide pattern;
   an upper redistribution structure disposed on the semiconductor chip and contacting the conductor pattern and the first guide pattern; and
   an encapsulant between the interposer and the upper redistribution structure,
   wherein the encapsulant contacts an inner wall of the main opening, an inner wall of the at least one sub-opening and a side surface of the first support.

2. The semiconductor package according to claim 1, wherein the at least one sub-opening protrudes from the main opening in a horizontal direction.

3. The semiconductor package according to claim 1, wherein the peripheral portion comprises a solder, and the core portion comprises at least one of nickel and copper.

4. The semiconductor package according to claim 1, wherein the lower surface of the first support contacts an upper surface of the upper passivation layer.

5. The semiconductor package according to claim 1, wherein:
   an upper surface of the first support is disposed at a same level as an upper surface of the conductor pattern; and
   the lower surface of the first support is disposed at a higher level than a lower surface of the conductor pattern.

6. The semiconductor package according to claim 1, wherein the at least one sub-opening comprises a plurality of sub-openings disposed to be spaced apart from one another by a uniform distance along a circumference of the main opening.

7. The semiconductor package according to claim 1, wherein the at least one sub-opening comprises a plurality of sub-openings symmetrically disposed with respect to the main opening.

8. The semiconductor package according to claim 7, wherein the plurality of sub-openings extends in the same direction.

9. The semiconductor package according to claim 1, wherein the at least one sub-opening has a length of 12 μm or more and a width of 50 to 120 μm.

10. The semiconductor package according to claim 1, wherein the at least one sub-opening comprises a sub-opening through which the main opening communicates with an exterior of the first guide pattern.

11. The semiconductor package according to claim 1, further comprising:
   a second guide pattern disposed adjacent to the first guide pattern; and
   a second support disposed adjacent to the first support,
   wherein the first guide pattern comprises a first main opening, and the second guide pattern comprises a second main opening, and
   wherein the first support is disposed in the first main opening, and a second support is disposed in the second main opening.

12. The semiconductor package according to claim 11, wherein the first guide pattern comprises a sub-opening through which the first main opening communicates with an exterior of the first guide pattern.

13. The semiconductor package according to claim 1, further comprising:
   a second support disposed adjacent to the first support,
   wherein the first guide pattern comprises a first main opening in which the first support is disposed, and a second main opening in which the second support is disposed.

14. The semiconductor package according to claim 13, wherein the first guide pattern comprises a connection passage interconnecting the first main opening and the second main opening.

15. The semiconductor package according to claim 1, wherein:
   the upper passivation layer comprises a recessed region formed along the main opening;
   the lower surface of the first support contacts a bottom surface of the recessed region; and
   the encapsulant contacts the bottom surface of the recessed region.

16. The semiconductor package according to claim 15, wherein the recessed region further extends along the at least one sub-opening.

17. A method for manufacturing a semiconductor package, comprising:
   providing an interposer comprising, at an upper surface thereof, an upper pad and an upper passivation layer partially covering the upper pad;
   forming, on the interposer, an insulating material to cover the upper passivation layer;
   patterning the insulating material, thereby forming a guide pattern comprising, therein, a main opening and at least one sub-opening connected to the main opening;
   mounting a semiconductor chip on the interposer;
   stacking an upper redistribution structure connected to a conductor pattern and a support on the interposer and the semiconductor chip, a lower surface of the support being disposed in the main opening; and
   forming an encapsulant to cover the semiconductor chip, the conductor pattern and the support.

18. The method according to claim 17, wherein the encapsulant covers an inner wall of the main opening, an inner wall of the at least one sub-opening and a side surface of the support.

19. A semiconductor package comprising:
   a lower package; and
   an upper package on the lower package,
   wherein the lower package comprises:
      an interposer comprising an upper pad and an upper passivation layer partially covering the upper pad;
      a lower semiconductor chip disposed on the interposer;
      a conductor pattern disposed on the interposer and contacting the upper pad;
      a guide pattern disposed on the interposer, the guide pattern comprising a main opening and at least one sub-opening connected to the main opening;
      a support disposed on the interposer, the support comprising a core portion and a peripheral portion surrounding the core portion, and a lower surface of the support being disposed in the main opening of the guide pattern;
      an upper redistribution structure disposed on the lower semiconductor chip and contacting the conductor pattern and the guide pattern; and
      an encapsulant between the interposer and the upper redistribution structure,
   wherein the encapsulant contacts an inner wall of the main opening, an inner wall of the at least one sub-opening, and a side surface of the support.

20. The semiconductor package according to claim 19, wherein:
   the upper package comprises:
      a substrate;
      a package connection terminal disposed under the substrate and electrically connected to the upper redistribution structure; and
      an upper semiconductor chip on the substrate; and
   the upper semiconductor chip is electrically connected to the upper redistribution structure via the substrate and the package connection terminal.

\* \* \* \* \*